US012652026B2

(12) United States Patent (10) Patent No.: US 12,652,026 B2
Lin (45) Date of Patent: Jun. 9, 2026

(54) CLOCK OUTPUT DEVICE AND CLOCK DETECTION METHOD

(71) Applicant: REALTEK SEMICONDUCTOR CORPORATION, Hsinchu (TW)

(72) Inventor: Yun-Hsien Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 9 days.

(21) Appl. No.: 18/659,520

(22) Filed: May 9, 2024

(65) Prior Publication Data

US 2024/0388279 A1 Nov. 21, 2024

(30) Foreign Application Priority Data

May 15, 2023 (TW) .................................. 112117929

(51) Int. Cl.
*H03K 3/013* (2006.01)
*G06F 1/08* (2006.01)
*G06F 1/12* (2006.01)

(52) U.S. Cl.
CPC ............... *H03K 3/013* (2013.01); *G06F 1/08* (2013.01); *G06F 1/12* (2013.01)

(58) Field of Classification Search
CPC .. H03K 3/013; G06F 1/08; G06F 1/12; G06F 1/04
USPC ....................................................... 327/291
See application file for complete search history.

(56) References Cited

U.S. PATENT DOCUMENTS

| | | | |
|---|---|---|---|
| 2005/0157829 A1* | 7/2005 | Aoyama ................... | H03L 7/08 |
| | | | 375/376 |
| 2005/0164722 A1* | 7/2005 | Akiyama ............... | H03G 3/345 |
| | | | 455/501 |
| 2007/0152719 A1* | 7/2007 | Wu ........................... | G06F 1/08 |
| | | | 327/99 |
| 2010/0134164 A1* | 6/2010 | Ku ......................... | H03L 7/0814 |
| | | | 327/158 |
| 2011/0032787 A1* | 2/2011 | Kim ......................... | G11C 8/06 |
| | | | 365/233.1 |
| 2011/0060975 A1* | 3/2011 | Pappalardo ......... | G06F 11/1608 |
| | | | 714/E11.002 |
| 2011/0285429 A1* | 11/2011 | Kawanaka ............ | G06F 1/3243 |
| | | | 327/142 |
| 2024/0007111 A1* | 1/2024 | El-halwagy .......... | H03K 5/1565 |
| 2024/0388279 A1* | 11/2024 | Lin ............................ | G06F 1/08 |
| 2025/0266012 A1* | 8/2025 | Ichikura ............... | G09G 3/3688 |

* cited by examiner

*Primary Examiner* — Ryan Jager
(74) *Attorney, Agent, or Firm* — WPAT, PC

(57) ABSTRACT

A clock output device includes a noise detector circuit and a clock buffer circuit. The noise detector circuit is configured to be enabled according to a request signal to determine whether a reference clock signal is a noise according to at least one of a common-mode level or a frequency of the reference clock signal and generate an enable signal. The clock buffer circuit is configured to be enabled according to the enable signal to generate an output clock signal according to the reference clock signal.

12 Claims, 5 Drawing Sheets

400

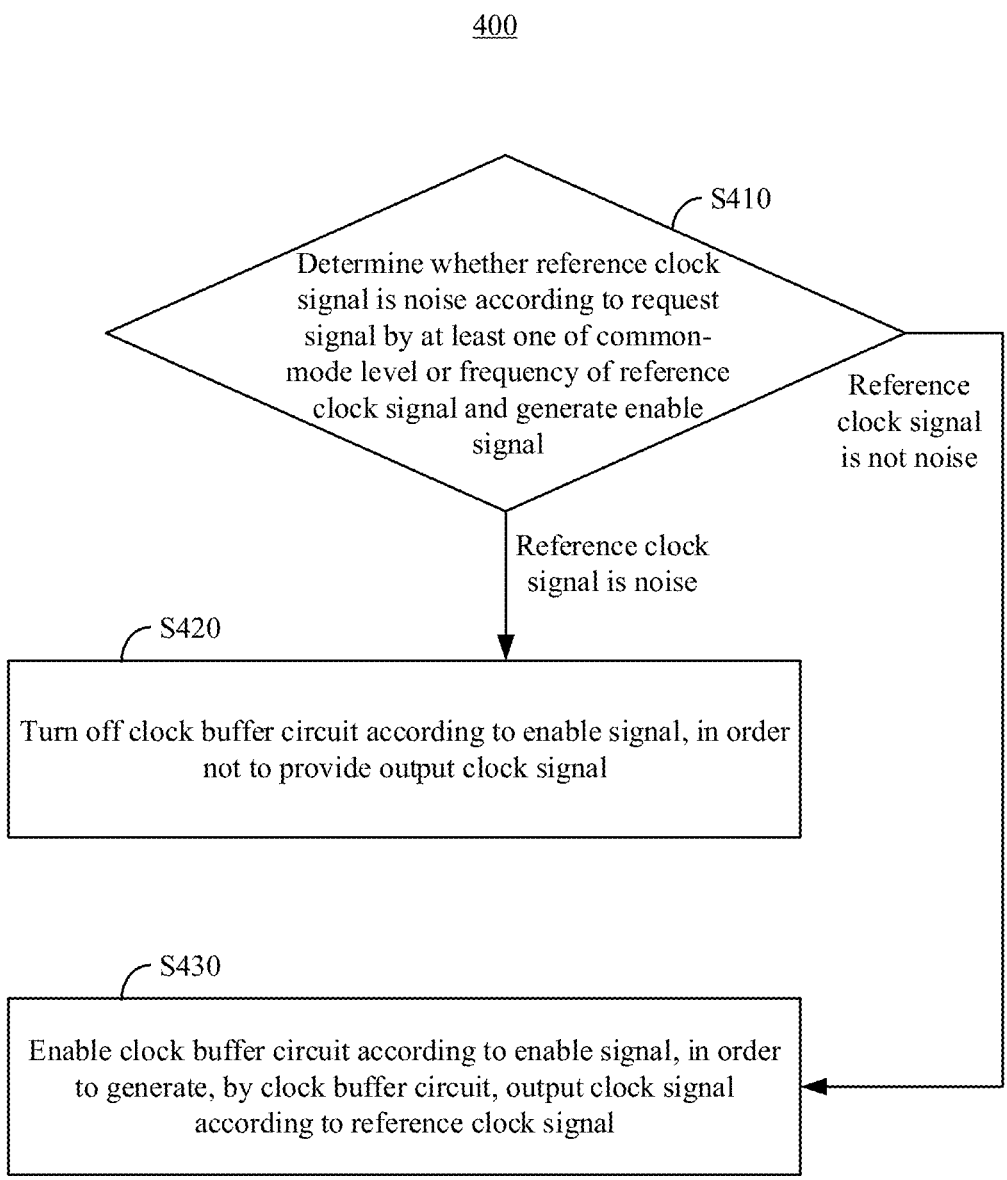

S410

Determine whether reference clock signal is noise according to request signal by at least one of common-mode level or frequency of reference clock signal and generate enable signal Reference clock signal is not noise Reference clock signal is noise

S420

Turn off clock buffer circuit according to enable signal, in order not to provide output clock signal

S430

Enable clock buffer circuit according to enable signal, in order to generate, by clock buffer circuit, output clock signal according to reference clock signal

Fig. 4

CLOCK OUTPUT DEVICE AND CLOCK DETECTION METHOD

BACKGROUND OF THE INVENTION

1. Field of the Invention

The present disclosure relates to a clock output device. More particularly, the present disclosure relates to a clock output device and a clock detection method that are able to prevent impacts from noises.

2. Description of Related Art

In some transmission protocols, a host circuit may need to provide a clock signal to a device-end circuit for synchronization. When switching from a power-saving mode back to a normal mode, a clock generator in the host circuit (which may be, for example but not limited to, a phase-locked loop circuit) requires a certain period to start up before being able to start generating the clock signal. During this period, if the device-end circuit mistakenly interprets noise as the clock signal provided by the host circuit, the device-end circuit may synchronize according to this noise. As a result, the malfunctioning of the device-end circuit may be caused.

SUMMARY OF THE INVENTION

In some aspects, an object of the present disclosure is to, but not limited to, provide a clock output device and a clock detection method that are able to prevent impacts from noises, so as to make an improvement to the prior art.

In some aspects of the present disclosure, a clock output device includes a noise detector circuit and a clock buffer circuit. The noise detector circuit is configured to be enabled according to a request signal and determine whether a reference clock signal is a noise based on at least one of a common-mode level or a frequency of the reference clock signal to generate an enable signal. The clock buffer circuit is configured to be enabled according to the enable signal to generate an output clock signal according to the reference clock signal.

In some aspects of the present disclosure, a clock detection method includes the following operations: determining whether a reference clock signal is a noise according to a request signal by at least one of a common-mode level or a frequency of the reference clock signal, in order to generate an enable signal; and enabling a clock buffer circuit according to the enable signal, in order to generate an output clock signal by the clock buffer circuit according to the reference clock signal.

These and other objectives of the present disclosure will no doubt become obvious to those of ordinary skill in the art after reading the following detailed description of the preferred embodiments that are illustrated in the various figures and drawings.

BRIEF DESCRIPTION OF THE DRAWINGS

FIG. 4 illustrates a flowchart of a clock detection method according to some embodiments of the present disclosure.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system implemented with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For case of understanding, like elements in various figures are designated with the same reference number.

Figure 1A:
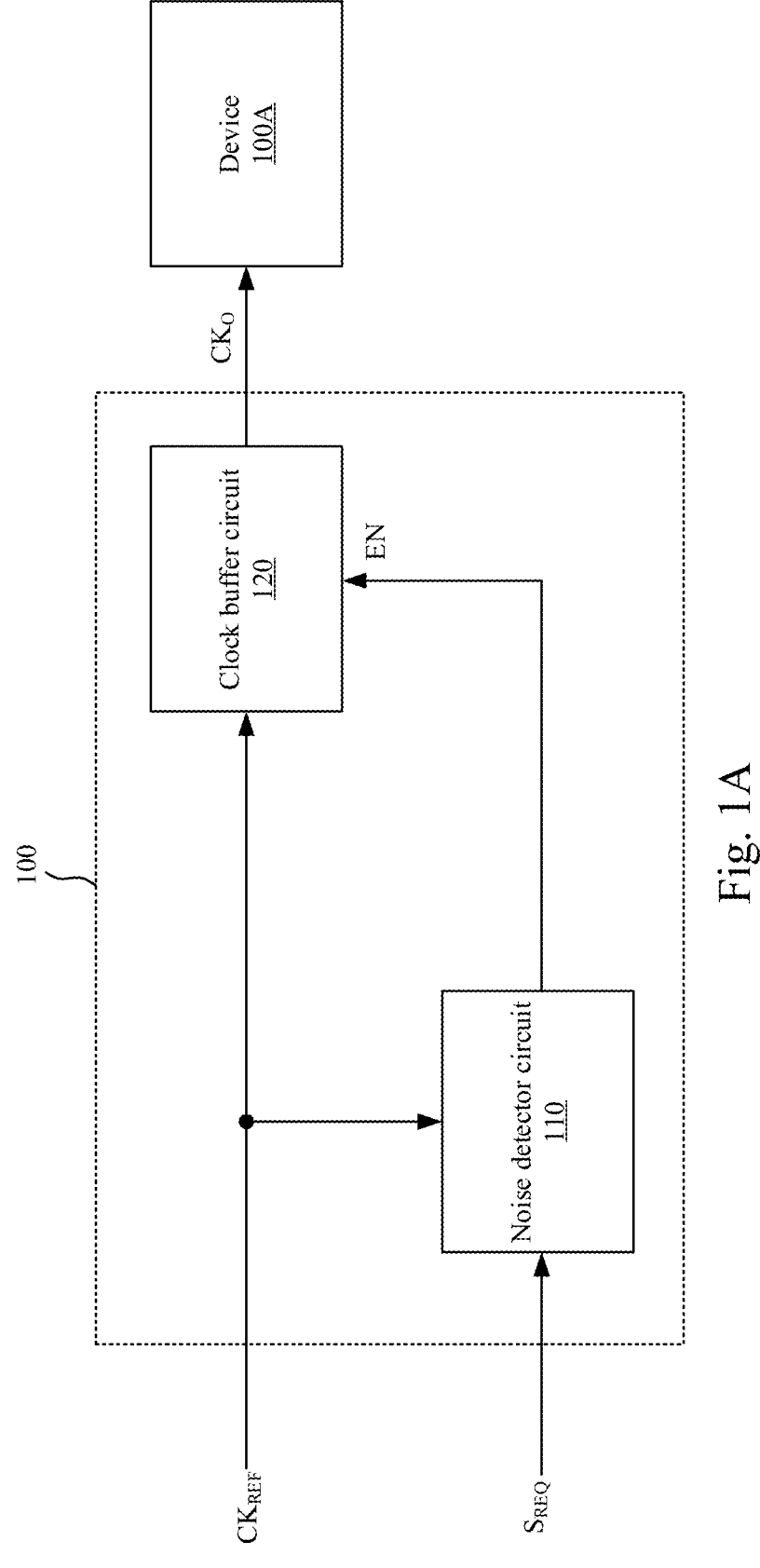
FIG. 1A illustrates a schematic diagram of a clock output device according to some embodiments of the present disclosure.

FIG. 1A illustrates a schematic diagram of a clock output device 100 according to some embodiments of the present disclosure. In some embodiments, the clock output device 100 may determine whether a reference clock signal $CK_{REF}$ from a host circuit (not shown) is noise based on a specific signal (e.g., request signal $S_{REQ}$ described below) in a predetermined protocol, in order to selectively provide the reference clock signal $CK_{REF}$ to a device 100A. In some embodiments, the predetermined protocol may include, but is not limited to, a peripheral component interconnect express (PCI-E) protocol. In some embodiments, the clock output device 100 may be integrated into the device 100A.

The clock output device 100 includes a noise detector circuit 110 and a clock buffer circuit 120. The noise detector circuit 110 may be enabled according to the request signal $S_{REQ}$ and determine whether the currently received reference clock signal $CK_{REF}$ is noise according to at least one of a common-mode level or a frequency of the reference clock signal $CK_{REF}$, in order to generate an enable signal EN. In some embodiments, both of the request signal $S_{REQ}$ and the reference clock signal $CK_{REF}$ are associated with the predetermined protocol. For example, the request signal $S_{REQ}$ may be a signal in the PCI-E protocol utilized to indicate whether the device 100A switches to a power-saving mode. For instance, when the request signal $S_{REQ}$ has a first level (which may be, for example but not limited to, a high level), the device 100A operates in the power-saving mode (also known as sleep mode or suspend mode). When the request signal $S_{REQ}$ has a second level (which may be, for example but not limited to, a low level), the device 100A operates in a normal mode (also known as resume mode). When operating in the normal mode, the host circuit (not shown) starts generating the reference clock signal $CK_{REF}$ to the device 100A, in order to synchronize with the device 100A. In some embodiments, the host circuit may send the request signal $S_{REQ}$ to request the device 100A to switch to the power-saving mode or to the normal mode.

In some embodiments, the voltage range requirement of the reference clock signal $CK_{REF}$ in the PCI-E protocol is approximately 250 to 550 millivolts (mV). Under this condition, the noise detector circuit 110 may be enabled according to the request signal $S_{REQ}$ and determine whether the common-mode level of the reference clock signal $CK_{REF}$ exceeds a threshold voltage (e.g., the threshold voltage VTH in FIG. 2), in order to determine whether the currently received reference clock signal $CK_{REF}$ is noise. The aforementioned threshold voltage VTH may be determined based on the voltage range requirement of the reference clock signal $CK_{REF}$ in the PCI-E protocol. For example, the threshold voltage VTH may be set to be a lower limit of the aforementioned voltage range (e.g., about 250 mV). Alternatively, considering variations in practical applications or circuit design requirements, the threshold voltage VTH may be set slightly below this lower limit (e.g., about 200 mV). The above-mentioned values for the threshold voltage VTH are given for illustrative purposes and the present disclosure is not limited thereto.

Alternatively, in the PCI-E protocol, the predetermined frequency of the reference clock signal $CK_{REF}$ is approximately 100 million Hertz (MHz). Under this condition, the noise detector circuit 110 may be enabled according to the request signal $S_{REQ}$ and determine whether the frequency of the reference clock signal $CK_{REF}$ is the predetermined frequency, in order to determine whether the currently received reference clock signal $CK_{REF}$ is noise. Operations regarding herein will be explained with reference to FIGS. 2 and 3. In some other embodiments, the noise detector circuit 110 may also determine whether the reference clock signal $CK_{REF}$ is noise based on both of the common-mode level and the frequency of the reference clock signal $CK_{REF}$. Under this condition, the noise detector circuit 110 may be implemented with circuits shown in both FIGS. 2 and 3.

The clock buffer circuit 120 is enabled according to the enable signal EN to generate an output clock signal $CK_O$ according to the reference clock signal $CK_{REF}$ and provides the output clock signal $CK_O$ to the device 100A. Thus, the device 100A may synchronize with the host circuit according to the output clock signal $CK_O$. In some embodiments, the clock buffer circuit 120 may be a buffer circuit with power gating, which may be powered according to the enable signal EN to output the reference clock signal $CK_{REF}$ as the output clock signal $CK_O$. The aforementioned implementation of the clock buffer circuit 120 is given for illustrative purposes, and the present disclosure is not limited thereto.

Figure 1B:
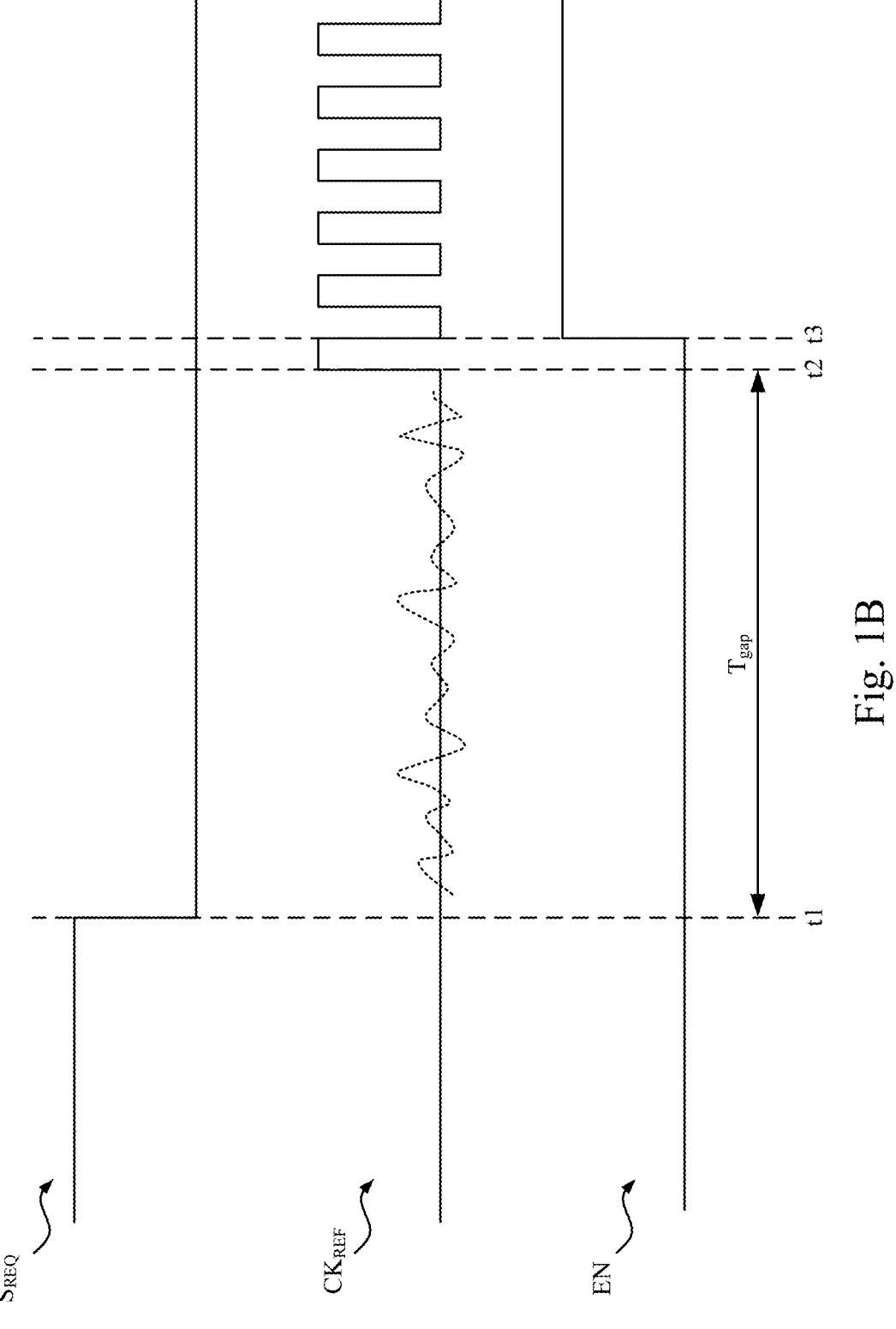
FIG. 1B illustrates a schematic diagram of waveforms of the reference clock signal, the request signal, and the enable signal in FIG. 1A according to some embodiments of the present disclosure.

FIG. 1B illustrates a schematic diagram of waveforms of the reference clock signal $CK_{REF}$, the request signal $S_{REQ}$, and the enable signal EN in FIG. 1A according to some embodiments of the present disclosure. As shown in FIG. 1B, before time t1, the request signal $S_{REQ}$ has a high level.

Under this condition, the device 100A may operate in the power-saving mode, and the host circuit (not shown) has not yet started to generate the reference clock signal $CK_{REF}$. At time t1, the request signal $S_{REQ}$ switches from the high level to a low level. Under this condition, the device 100A may switch to operate in the normal mode, and the host circuit begins to generate the reference clock signal $CK_{REF}$ to synchronize with the device 100A.

During a period $T_{gap}$ starting from time t1 (e.g., the period between time t1 and time t2), the clock generator in the host circuit (not shown) is starting up and has not yet begun to send the reference clock signal $CK_{REF}$. During this period $T_{gap}$, the reference clock signal $CK_{REF}$ may be subject to various interferences to generate random jitter (as shown by the dashed line; which may be considered as noise). The noise detector circuit 110 may determine that the reference clock signal $CK_{REF}$ during this period $T_{gap}$ is noise and outputs the enable signal EN having a low level. As a result, the clock buffer circuit 120 is not enabled, and the device 100A does not synchronize according to the reference clock signal $CK_{REF}$.

At time t3, the clock generator in the host circuit completes start-up and begins to send out the reference clock signal $CK_{REF}$, and the noise detector circuit 110 may determine that the reference clock signal $CK_{REF}$ is not noise, thereby generating the enable signal EN having a high level to enable the clock buffer circuit 120. Under this condition, the clock buffer circuit 120 generates the output clock signal $CK_O$ according to the reference clock signal $CK_{REF}$, such that the device 100A synchronizes with the output clock signal $CK_O$. It is understood that the occurrences of times in FIG. 1B are given for illustrative purposes, and the present disclosure is not limited thereto. According to practical applications, time t3 may occur earlier or later.

In some related approaches, the host circuit directly transmits the reference clock signal CKREF to the device 100A without noise detection. In these approaches, the device 100A might erroneously synchronize with the noise on the reference clock signal CKREF during the period $T_{gap}$, leading to errors in circuit operation. Compared with these approaches, with the noise detector circuit 110, it is able to determine whether the reference clock signal CKREF is noise by detecting its common-mode level and/or frequency, and synchronize with the device 100A only when the reference clock signal CKREF is not noise. As a result, errors in circuit operation can be effectively prevented.

Figure 2:
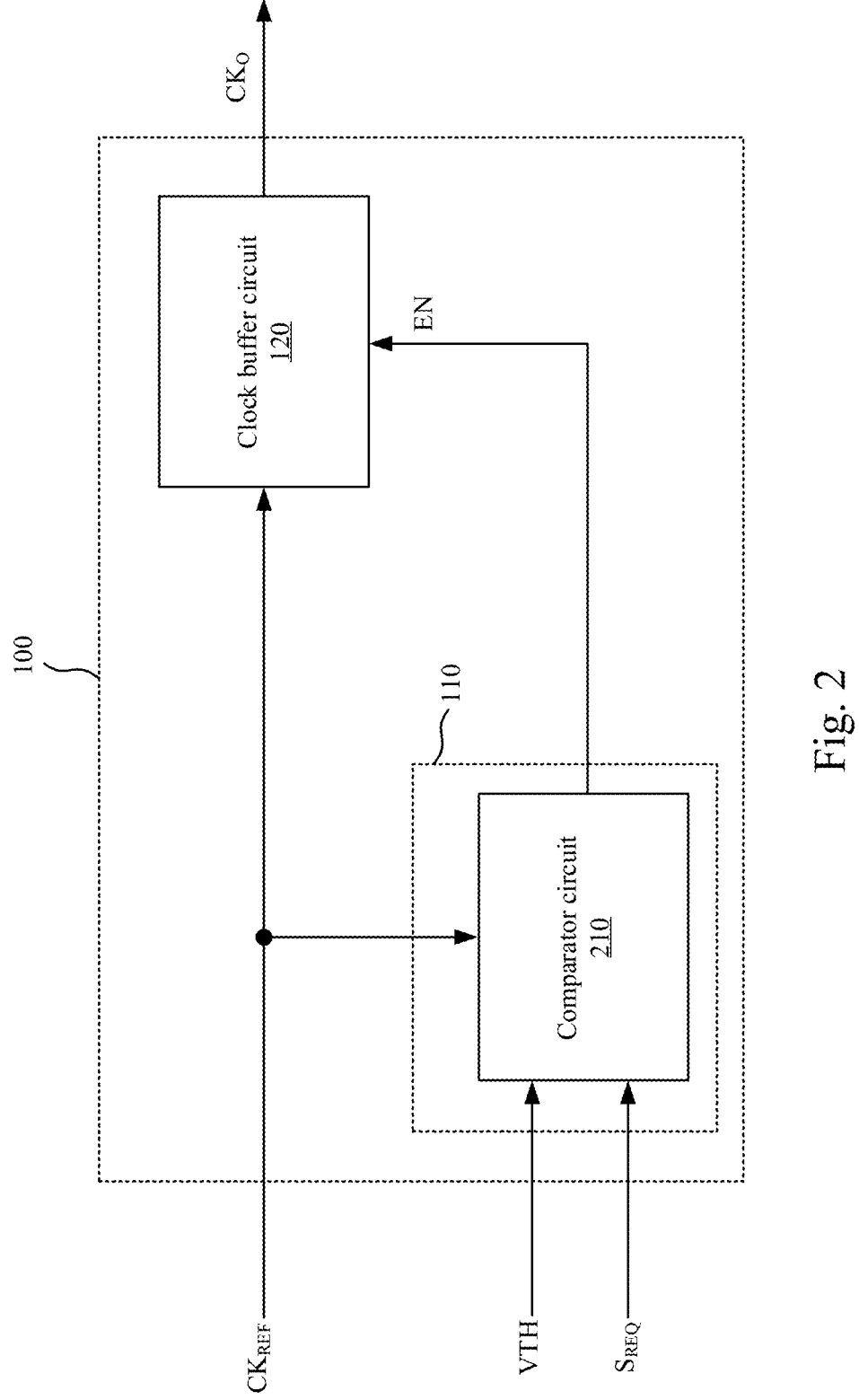
FIG. 2 illustrates a schematic diagram of the clock output device in FIG. 1A according to some embodiments of the present disclosure.

FIG. 2 illustrates a schematic diagram of the clock output device 100 in FIG. 1A according to some embodiments of the present disclosure. In this example, the noise detector circuit 110 may be a comparator circuit 210, which is enabled according to the request signal $S_{REQ}$ and determines whether the common-mode level of the reference clock signal $CK_{REF}$ exceeds the threshold voltage VTH to generate the enable signal EN. In some embodiments, the threshold voltage VTH may be determined based on the voltage range requirement of the reference clock signal $CK_{REF}$ in the PCI-E protocol. As previously mentioned, in the PCI-E protocol, the voltage range requirement of the reference clock signal $CK_{REF}$ is approximately 250 to 550 mV. Under this condition, the threshold voltage VTH may be determined based on the lower limit of this voltage range requirement (which may be, for example, the aforementioned 250 mV or 200 mV, but the present case is not limited to these values).

In greater detail, when the request signal $S_{REQ}$ indicates that the device 100A switches to the normal mode (e.g., when the request signal $S_{REQ}$ switches from the high level to the low level), the comparator circuit 210 may be enabled and start comparing the reference clock signal $CK_{REF}$ with the threshold voltage VTH. When the comparator circuit 210 detects that the common-mode level of the reference clock signal $CK_{REF}$ is greater than the threshold voltage VTH, it indicates that the host circuit is stably generating the reference clock signal $CK_{REF}$ and the received reference clock signal $CK_{REF}$ is not noise. Accordingly, the comparator circuit 210 may generate the enable signal EN to enable the clock buffer circuit 120, allowing the device 100A to synchronize according to the reference clock signal $CK_{REF}$. Alternatively, if the comparator circuit 210 detects that the level of the reference clock signal $CK_{REF}$ is not greater than the threshold voltage VTH, it indicates that the reference clock signal $CK_{REF}$ may be noise (i.e., the host circuit is not yet able to stably generate the reference clock signal $CK_{REF}$). Accordingly, the comparator circuit 210 may output the corresponding enable signal EN to turn off the clock buffer circuit 120, thus preventing errors in the device 100A.

Arrangements shown in FIG. 2 are given for illustrative purposes, and the present disclosure is not limited thereto. Various circuits able to determine whether the common-mode level meets the voltage requirement are contemplated within the scope of the present disclosure. For example, in some other embodiments, the noise detector circuit 110 may include an analog-to-digital converter circuit (not shown) and a control logic circuit (not shown). The analog-to-digital converter circuit may convert the reference clock signal $CK_{REF}$ into a digital code according to the threshold voltage VTH, and the control logic circuit may determine whether the reference clock signal $CK_{REF}$ is greater than a target digital code corresponding to the threshold voltage VTH, to determine whether the reference clock signal $CK_{REF}$ is noise.

Figure 3:
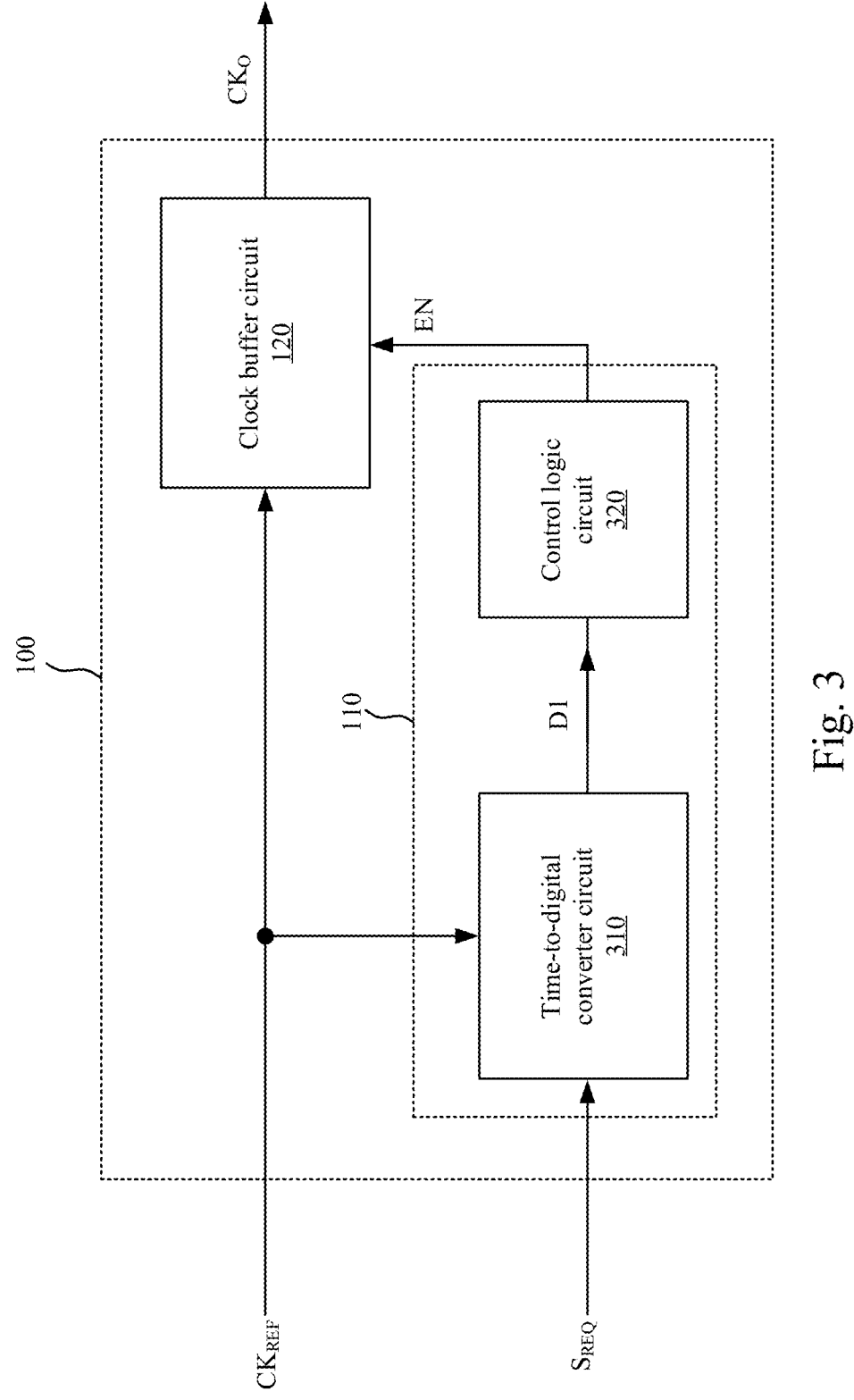
FIG. 3 illustrates a schematic diagram of the clock output device in FIG. 1A according to some embodiments of the present disclosure.

FIG. 3 illustrates a schematic diagram of the clock output device 100 in FIG. 1A according to some embodiments of the present disclosure. In this example, the noise detector circuit 110 may determine whether the frequency of the reference clock signal $CK_{REF}$ is a predetermined frequency according to the request signal $S_{REQ}$, in order to generate the enable signal EN. For example, the noise detector circuit 110 includes a time-to-digital converter circuit 310 and a control logic circuit 320. The time-to-digital converter circuit 310 may be enabled according to the request signal $S_{REQ}$ to generate a digital code D1 based on the reference clock signal $CK_{REF}$, in which the digital code D1 may indicate time information of the reference clock signal $CK_{REF}$ (e.g., the duration of a cycle). The control logic circuit 320 may determine whether the frequency of the reference clock signal $CK_{REF}$ is the predetermined frequency according to the digital code D1, in order to determine whether the reference clock signal $CK_{REF}$ is noise. For example, if the digital code D1 is a target digital code corresponding to the predetermined frequency, the control logic circuit 320 may determine that the reference clock signal $CK_{REF}$ is not noise and generate the enable signal EN to enable the clock buffer circuit 120. Alternatively, if the digital code D1 is not the target digital code, the control logic circuit 320 may determine that the reference clock signal $CK_{REF}$ is noise and generate the enable signal EN with a different level to keep the clock buffer circuit 120 turned off. As mentioned above, the predetermined frequency may be determined based on the frequency requirement of the reference clock signal $CK_{REF}$ in the PCI-E protocol, for example, the predetermined frequency may be set to approximately 100 MHz.

In greater detail, when the request signal $S_{REQ}$ indicates that the device 100A switches to the normal mode (e.g., when the request signal $S_{REQ}$ switches from the high level to the low level), the time-to-digital converter circuit 310 may be enabled and generate the digital code D1 according to the reference clock signal $CK_{REF}$, and the control logic circuit 320 may determine whether the frequency of the reference clock signal $CK_{REF}$ is the predetermined frequency according to the digital code D1. When the control logic circuit 320 detects that the frequency of the reference clock signal $CK_{REF}$ is the predetermined frequency, it indicates that the host circuit is stably generating the reference clock signal $CK_{REF}$. Accordingly, the control logic circuit 320 may generate the enable signal EN to enable the clock buffer circuit 120, allowing the device 100A to synchronize according to the reference clock signal $CK_{REF}$. Alternatively, if the control logic circuit 320 detects that the frequency of the reference clock signal $CK_{REF}$ is not the predetermined frequency, it indicates that the host circuit has not yet been able to stably generate the reference clock signal $CK_{REF}$. Accordingly, the control logic circuit 320 may turn off the clock buffer circuit 120 to prevent errors in the device 100A. Arrangements in FIG. 3 are given for illustrative purposes, and the present disclosure is not limited thereto. Various circuits able to determine whether the frequency meets the frequency requirement are contemplated within the scope of the present disclosure. In some embodiments, the control logic circuit 320 may be, but is not limited to, at least one logic circuit able to perform the aforementioned determination operations.

FIG. 4 illustrates a flowchart of a clock detection method 400 according to some embodiments of the present disclosure. In operation S410, whether a reference clock signal is noise is determined according to a request signal by at least one of a common-mode level or a frequency of the reference clock signal to generate an enable signal. In operation S420, if the reference clock signal is noise, a clock buffer circuit is turned off according to the enable signal, in order not to provide an output clock signal. In operation S430, if the reference clock signal is not noise, the clock buffer circuit is enabled according to the enable signal, and generates the output clock signal by the clock buffer circuit according to the reference clock signal.

The above operations of the clock detection method 400 can be understood with reference to above embodiments, and thus the repetitious descriptions are not further given. The above description of the clock detection method 400 includes exemplary operations, but the operations of the clock detection method 400 are not necessarily performed in the order described above. Operations of the clock detection method 400 may be added, replaced, changed order, and/or eliminated, or the operations of the clock detection method 400 may be executed simultaneously or partially simultaneously as appropriate, in accordance with the spirit and scope of various embodiments of the present disclosure.

As described above, the clock output device and clock detection method provided in some embodiments of the present disclosure may determine whether the reference clock signal provided by the host circuit is noise, in order to selectively provide the reference clock signal to subsequent devices for synchronization. As a result, it is able to prevent operational errors in these subsequent devices.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. A clock output device, comprising:
a noise detector circuit configured to be enabled according to a request signal and determine whether a reference clock signal is a noise based on a common-mode level or a of the reference clock signal to generate an enable signal,
wherein the noise detector circuit is configured to determine whether the common-mode level of the reference clock signal exceeds a threshold voltage according to the request signal, to generate the enable signal; and
a clock buffer circuit configured to be enabled according to the enable signal to generate an output clock signal according to the reference clock signal.

2. The clock output device of claim 1, wherein the request signal is associated with a peripheral component interconnect express protocol.

3. The clock output device of claim 1, wherein the clock buffer circuit is further configured to transmit the output clock signal to a device, and the request signal is a signal in a peripheral component interconnect express protocol that indicates whether the device switches to a power-saving mode.

4. The clock output device of claim 1, wherein the threshold voltage is determined based on a voltage range requirement of the reference clock signal in a peripheral component interconnect express protocol.

5. The clock output device of claim 1, wherein the noise detector circuit is a comparator circuit.

6. The clock output device of claim 1, wherein the clock buffer circuit is further configured to transmit the output clock signal to a device, and when the request signal switches from a first level to a second level, the device switches from a power-saving mode to a normal mode.

7. A clock detection method, comprising:
determining whether a reference clock signal is a noise according to a request signal by a common-mode level of the reference clock signal, in order to generate an enable signal; and
enabling a clock buffer circuit according to the enable signal, in order to generate an output clock signal by the clock buffer circuit according to the reference clock signal,
wherein determining whether the reference clock signal is the noise according to the request signal by the common-mode level of the reference clock signal, in order to generate the enable signal comprises:
determining whether the common-mode level of the reference clock signal exceeds a threshold voltage according to the request signal, to generate the enable signal.

8. The clock detection method of claim 7, wherein the request signal is associated with a peripheral component interconnect express protocol.

9. The clock detection method of claim 7, wherein the clock buffer circuit is further configured to transmit the output clock signal to a device, and the request signal is a signal in a peripheral component interconnect express protocol that indicates whether the device switches to a power-saving mode.

10. The clock detection method of claim 7, wherein determining whether the common-mode level of the reference clock signal exceeds the threshold voltage according to the request signal, to generate the enable signal comprises:
enabling a comparator circuit according to the request signal; and
determining, by the comparator circuit, the common-mode level of the reference clock signal exceeds the threshold voltage, to generate the enable signal.

11. The clock detection method of claim 7, wherein the threshold voltage is determined based on a voltage range requirement of the reference clock signal in a peripheral component interconnect express protocol.

12. The clock detection method of claim 7, wherein the clock buffer circuit is further configured to transmit the output clock signal to a device, and when the request signal switches from a first level to a second level, the device switches from a power-saving mode to a normal mode.

* * * * *